US012641939B2

(12) United States Patent
Wilcox et al.

(10) Patent No.: US 12,641,939 B2
(45) Date of Patent: May 26, 2026

(54) LIGHT-EMITTING DIODE PACKAGES FOR ENVIRONMENTAL INDICATION

(71) Applicant: CreeLED, Inc., Durham, NC (US)

(72) Inventors: Robert Wilcox, Rolesville, NC (US); David Suich, Durham, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 418 days.

(21) Appl. No.: 18/312,751

(22) Filed: May 5, 2023

(65) Prior Publication Data

US 2024/0372052 A1 Nov. 7, 2024

(51) Int. Cl.
$$\begin{array}{ll} \textbf{\textit{H10H 20/857}} & (2025.01) \\ \textbf{\textit{H01L 25/075}} & (2006.01) \\ \textbf{\textit{H10H 20/85}} & (2025.01) \\ \textit{H10H 20/01} & (2025.01) \end{array}$$

(52) U.S. Cl.
CPC ....... H10H 20/857 (2025.01); H01L 25/0753 (2013.01); H10H 20/8506 (2025.01)

(58) Field of Classification Search
CPC ............. H10H 20/857; H10H 20/0364; H10H 20/8506; G08B 21/14; G08B 21/12; G01N 33/0036; H01L 25/0753
See application file for complete search history.

(56) References Cited

U.S. PATENT DOCUMENTS

2018/0202956 A1* 7/2018 Hsieh ................. G01N 33/0036
2023/0112649 A1 4/2023 Blakely et al.

* cited by examiner

*Primary Examiner* — Antonio B Crite
(74) *Attorney, Agent, or Firm* — Withrow & Terranova, P.L.L.C.

(57) ABSTRACT

Solid-state lighting devices including light-emitting diodes (LEDs) and more particularly LED packages for environmental indication are disclosed. LED packages include one or more LED chips and reactive materials that preferentially react with environmental ingress. After sufficient reactant exposure, the reactive materials may degrade and exhibit reduced electrical conductivity. Reactive material arrangements relative to electrical connections are provided so that the one or more LED chips either turn on, turn off, or lose brightness to provide visual indication of environmental reactants. Reactive materials may form electrical shorting paths that bypass one or more LED chips until sufficient reactant exposure when the shorting paths fail and the one or more LED chips are electrically activated. Alternatively, reactive materials may form parts of electrically conductive paths for the one or more LED chips such that with sufficient reactant exposure, the electrically conductive paths fail and the one or more LED chips are electrically deactivated.

14 Claims, 9 Drawing Sheets

LIGHT-EMITTING DIODE PACKAGES FOR ENVIRONMENTAL INDICATION

FIELD OF THE DISCLOSURE

The present disclosure relates to solid-state lighting devices including light-emitting diodes (LEDs) and more particularly to LED packages for environmental indication.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new applications.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from gallium nitride, gallium phosphide, aluminum nitride, gallium arsenide-based materials, and/or from organic semiconductor materials. Photons generated by the active region are initiated in all directions. LED packages have been developed that can provide mechanical support, electrical connections, and encapsulation for LED chips with suitable emission efficiencies.

The art continues to seek improved LEDs and solid-state lighting devices having desirable operating characteristics capable of overcoming challenges associated with conventional devices.

SUMMARY

The present disclosure relates to solid-state lighting devices including light-emitting diodes (LEDs) and more particularly to LED packages for environmental indication. LED packages include arrangements of one or more LED chips and reactive materials that preferentially react with environmental ingress. After sufficient reactant exposure, the reactive materials may degrade and exhibit reduced electrical conductivity. Arrangements of reactive materials relative to electrical connections are provided so that the one or more LED chips turn on, turn off, or lose brightness after sufficient exposure to environmental reactants, thereby providing visual indication. Reactive materials may form electrical shorting paths that bypass one or more LED chips until sufficient reactant exposure where the shorting paths fail and the one or more LED chips may be electrically activated. Alternatively, reactive materials may form parts of electrically conductive paths for the one or more LED chips such that with sufficient reactant exposure, the electrically conductive paths fail and the one or more LED chips are electrically deactivated.

In one aspect, an LED package comprises: at least one LED chip; a support structure comprising electrical connections, the electrical connections comprising an anode and a cathode coupled to the at least one LED chip; and a reactive material coupled between the anode and the cathode to provide a first operating state where the at least one LED chip is electrically shorted, the reactive material configured to decrease electrical conductivity with exposure to an environmental reactant to provide a second operating state where the at least one LED chip is electrically activated. In certain embodiments, the reactive material forms a bridge that is coupled between the anode and the cathode. In certain embodiments, the bridge extends from a top surface of the anode to a top surface of the cathode. In certain embodiments, the bridge extends between sidewalls of the anode and the cathode. In certain embodiments, the anode and cathode form a die attach pad for the at least one LED chip and the bridge is arranged on portions of the anode and cathode that are outside the die attach pad. In certain embodiments, the bridge covers at least half of a surface area of the portions of the anode and the cathode that are outside the die attach pad. In certain embodiments, the reactive material forms an additional bridge that is coupled between the anode and the cathode. In certain embodiments, portions of the anode and cathode form a die attach pad for the at least one LED chip and the bridge is arranged within a boundary of the die attach pad. In certain embodiments, the bridge comprises a thickness above the submount this is in a range from two times to ten times a thickness of the anode or cathode. In certain embodiments, the support structure comprises a submount and the electrical connections comprise a patterned trace on a top surface of the submount. In certain embodiments, the support structure comprises a lead frame structure and the electrical connections comprise portions of a lead frame. The LED package may further comprise a membrane on the reactive material, the membrane configured to permit the environmental reactant to pass through the membrane while reducing amounts of another environment reactant that pass through the membrane. In certain embodiments, the electrical connections extend on a perimeter edge of the support structure and the reactive material is positioned on the perimeter edge. In certain embodiments, the at least one LED chip comprises a plurality of LED chips electrically coupled in series.

In another aspect, an LED package comprises: at least one LED chip; a support structure comprising electrical connections, the electrical connections comprising an anode and a cathode coupled to the at least one LED chip; and a reactive material forming part of at least one of an anode electrically conductive path of the anode and a cathode electrically conductive path of the cathode to provide a first operating state where the at least one LED chip is electrically activated, the reactive material configured to decrease electrical conductivity with exposure to an environmental reactant to provide a second operating state where the at least one LED chip has a reduced brightness from the first operating state. In certain embodiments, the second operating state, the at least one LED chip is electrically deactivated. In certain embodiments, a first portion of the reactive material is formed as part of the anode electrically conductive path and a second portion of the reactive material is formed as part of the cathode electrically conductive path. In certain embodiments, the support structure comprises a submount, the anode comprises a first metal trace on a top surface of the submount, and the cathode comprises a second metal trace on a top surface of the submount. In certain embodiments, the anode electrically conductive path comprises the first metal trace on the top surface of the submount and a first mounting pad on a bottom surface of the submount, and the cathode electrically conductive path comprises the second metal trace on the top surface of the submount and a second mounting pad on the bottom surface of the submount. In certain embodiments, the first metal trace is coupled to the first mounting pad by a first via that extends through the submount, and the second metal trace is coupled to the second mounting pad by a second via that extends through the submount. In certain embodiments, the reactive material is arranged to extend on a perimeter edge of the submount from the top surface to the bottom surface as part of at least one of the anode electrically conductive path and the cathode electrically conductive path. The LED package may further comprise a membrane on the reactive material, the membrane configured to permit the environmental reactant to pass through the membrane while reducing amounts of another environment reactant that pass through the membrane. In certain embodiments, the at least one LED chip comprises a plurality of LED chips electrically coupled in series.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
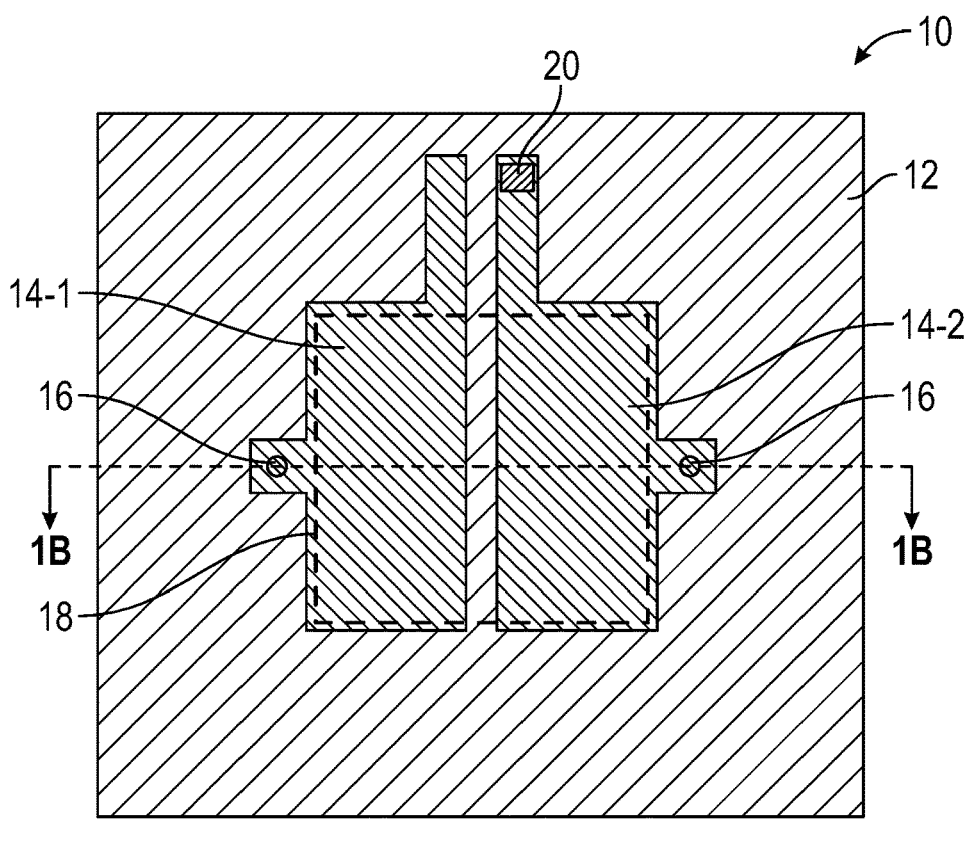
FIG. 1A is a top view of a portion of an exemplary light-emitting diode (LED) package that includes a support structure and a patterned trace according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to LED packages for environmental indication. LED packages include arrangements of one or more LED chips and reactive materials that preferentially react with environmental ingress. After sufficient reactant exposure, the reactive materials may degrade and exhibit reduced electrical conductivity. Arrangements of reactive materials relative to electrical connections are provided so that the one or more LED chips turn on, turn off, or lose brightness after sufficient exposure to environmental reactants, thereby providing visual indication. Reactive materials may form electrical shorting paths that bypass one or more LED chips until sufficient reactant exposure where the shorting paths fail and the one or more LED chips may be electrically activated. Alternatively, reactive materials may form parts of electrically conductive paths for the one or more LED chips such that with sufficient reactant exposure, the electrically conductive paths fail and the one or more LED chips are electrically deactivated.

Before delving into specific details of various aspects of the present disclosure, an overview of various elements that may be included in exemplary LED packages is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds. The active LED structure may be grown on a growth substrate that can include many materials, such as sapphire, SiC, aluminum nitride (AlN), and GaN, Different embodiments of the active LED structure can emit different wavelengths of light depending on the composition of the active layer and n-type and p-type layers. In certain embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum.

The LED chip may also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-AlSiN_3$) and combinations thereof. One or more lumiphoric materials may be provided on one or more portions of an LED chip and/or a submount in various configurations. In the context of UV emissions from an LED chip, one or more lumiphoric materials may be configured to convert at least a portion of the UV emissions to visible light for indicator purposes.

The present disclosure may be useful for LED chips having a variety of geometries, including flip-chip geometries. Flip-chip structures for LED chips typically include anode and cathode connections that are made from a same side or face of the LED chip. The anode and cathode side is typically structured as a mounting face of the LED chip for flip-chip mounting to another surface, such as a printed circuit board or a package submount. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member or support structure, such as a submount or a lead frame. Light-altering materials may be arranged within LED packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent.

Aspects of the present disclosure are provided that include support structures for LED packages. A support structure may refer to a structure of an LED package that supports one or more other elements of the LED package, including but not limited to LED chips and cover structures. Support structures may include one or more electrically conductive materials that may provide electrical connections to LED chips. Electrically conductive materials may be provided as metal traces or patterned metal traces on a submount, or the electrically conductive materials may form electrical leads of a lead frame structure that may or may not include a corresponding submount. Suitable materials for a submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si, or any other suitable material. For PCB embodiments, different PCB types can be used such as standard FR-4 PCB, metal core PCB, or any other type of PCB. In still further embodiments, the support structure may embody a lead frame structure.

The electrically conductive materials may include any number of materials, including copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the electrically conductive materials may include ENEPIG or ENIG that include a top layer of Au. In other embodiments, electrically conductive materials may include a top layer of Ag.

Aspects of the present disclosure are provided in the context of support structures for LED chips that may emit light in any number of wavelength ranges, including wavelengths within UV and/or visible light spectrums. Cover structures for visible light spectrums typically include silicone, polymers, and/or other organic materials that may also be referred to as encapsulants. For UV applications, high energy levels associated with UV emissions can lead to breakdown of common cover structure materials. Furthermore, cover structures for UV-based LED packages may also need to provide protection from external environmental exposure, such as providing hermetic sealing and the like. In this manner, cover structure materials for UV LEDs may include at least one of glass, quartz, and/or ceramic materials that provide reduced breakdown from exposure to UV emissions while also being able to be attached or otherwise bonded to package support structures to seal underlying LED chips.

According to principles of the present disclosure, LED packages are configured to serve as environmental indicators that alert the presence of various adverse environmental conditions and/or environmental reactants. Reactive materials may be incorporated within LED packages that preferentially react with molecules of certain environmental reactants upon exposure. The reactive materials may include various materials with lower redox potentials than other elements of the LED package, such as LED chips and corresponding electrical traces. For example, the reactive materials are preferential to absorbing environmental ingress of reactants by more readily losing electrons to oxidization than other elements of the LED package. In this manner, the reactive materials may effectively form scavenging materials that more readily attract and react with environmental ingress that makes its way within an LED package. The reactive materials may embody coatings, films, and/or three-dimensional structures that protrude from package support structures.

In certain embodiments, the reactive materials may be incorporated with electrical connections of LED packages so that after a certain amount of reactant exposure, degradation, oxidation and/or reduction of the reactive materials may cause the LED chip to turn on, turn off, or be subject to a resistance change that changes an operating brightness, thereby providing a visible indicator for the presence of various environmental conditions. For example, the reactive materials may be formed to electrically couple anode and cathode connections so that the LED chip is electrically shorted. After exposure and degradation, oxidation and/or reduction, the reactive materials may lose electrical conductivity thereby causing the LED chip to turn on and emit light. In other embodiments, reactive materials may be positioned as a portion of an anode electrical connection and/or a cathode electrical connection. In such embodiments, the anode and/or cathode electrical connections may lose electrical conductivity when the reactive materials degrade, thereby increasing electrical resistance along the anode and/or cathode electrical connections. Accordingly, an initially turned-on LED chip may be subject to reduced brightness output and/or the LED chip may turn off. As used herein, oxidation refers to reactions with a loss of an electron and reduction refers to reactions with a gain of an electron, both of which may change an electrical resistance of the reactive material.

Exemplary reactive materials may include electrically conductive metals, such as one or more of zinc, magnesium, iron, titanium, tungsten, and conductive polymers among others. In other embodiments where higher drive voltages are implemented, such as serially connected LED chips, increased activation energies may allow the use of other material as electrical conductors, such as magnesium oxide and/or titanium oxide. Accordingly, exemplary reactive materials generally include any inorganic material that is electrically conductive at intended drive voltages. Specific materials for implementation may be selected based on targeted environmental conditions, such as to indicate the presence of various reactants including oxygen, moisture, sulfur, sulfur dioxide, carbon monoxide, methane, ozone, nitrogen oxides ($NO_x$), and/or fluorinated gases, among others. Exemplary applications include implementations as reactant detectors in various occupied building spaces to detect toxic and/or flammable gases, in laboratory settings such as nitrogen glove boxes, and/or in electronic devices such as on circuit boards.

In certain embodiments, the rate of degradation, oxidation and/or reduction of the reactive materials may be controlled by increasing surface area and/or thickness of the reactive materials in LED packages. In this manner, adjusting the surface area and/or thickness of reactive materials may also adjust the amount of reactant exposure needed before failure.

FIG. 1A is a top view of a portion of an exemplary LED package 10 that includes a support structure 12 and a patterned trace 14-1, 14-2 according to principles of the present disclosure. The patterned trace 14-1, 14-2 is collectively formed of several individual traces 14-1 and 14-2 that are discontinuous with one another on a topside or top face of the support structure 12. FIG. 1A is described in the context where the support structure 12 embodies a submount; however, the principles described are also applicable to other arrangements of the support structure 12, such as lead frames.

As illustrated in FIG. 1A, vias 16 may be provided that electrically connect the patterned trace 14-1, 14-2 to corresponding electrical connections on a backside or bottom face of the support structure 12. The patterned trace 14-1, 14-2 forms a die attach pad 18 for an LED chip where one of the individual traces 14-1 or 14-2 forms an anode pad of the die attach pad 18, and the other of the individual traces 14-1 or 14-2 forms a corresponding cathode pad of the die attach pad 18. In this manner, an LED chip may be flip-chip mounted to the die attach pad 18. In certain embodiments, protrusions of the patterned trace 14-1, 14-2 along the support structure 12 may extend away from the die attach pad 18 to position the vias 16 away from the mounting area of the LED package 10. Other protrusions may extend away from the die attach pad 18 to form an attach area for another element, such as an electrical overstress element 20 (e.g., ESD chip, Zener diode, etc.) that may be coupled in parallel with the LED chip. For example, the electrical overstress element 20 of FIG. 1A may be mounted to the individual trace 14-2 and wire bonded to the individual trace 14-1. In other embodiments, the electrical overstress element 20 may alternatively be flip-chip mounted without the use of a wire bond. The patterned trace 14-1, 14-2 may include one or more layers of any of the electrically conductive materials described above for patterned metal traces.

Figure 1B:
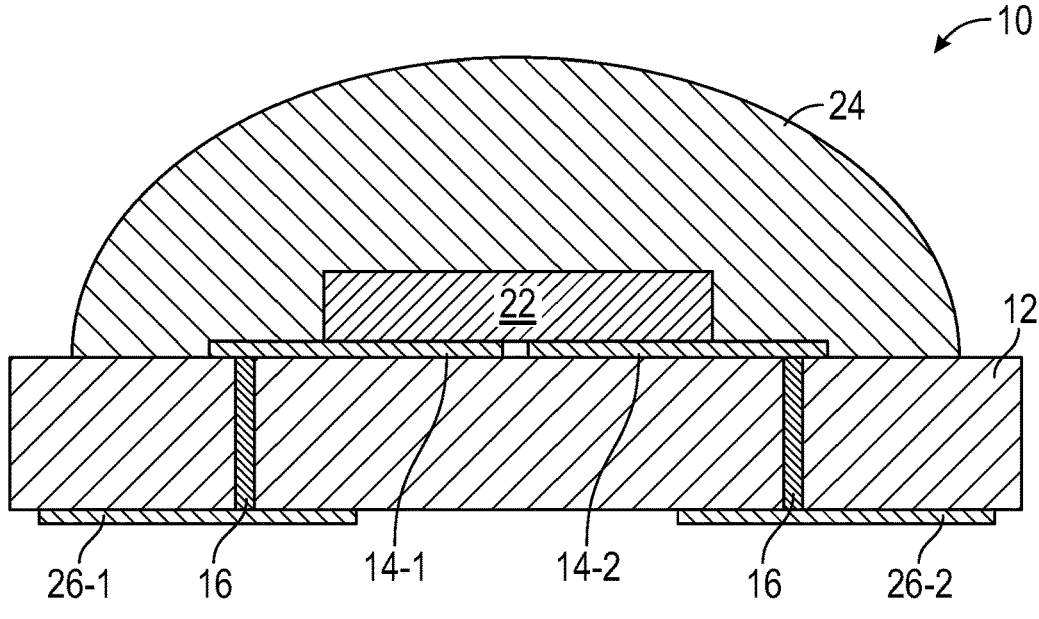
FIG. 1B is a cross-sectional view of the LED package of FIG. 1A taken along the sectional line 1B-1B of FIG. 1A and wherein the LED package is further assembled with at least one LED chip and a cover structure according to principles of the present disclosure.

FIG. 1B is a cross-sectional view of the LED package 10 of FIG. 1A taken along the sectional line 1B-1B of FIG. 1A and wherein the LED package 10 is further assembled with at least one LED chip 22 and a cover structure 24 according to principles of the present disclosure. As illustrated, the LED chip 22 is mounted and electrically coupled to the patterned trace 14-1, 14-2. The vias 16 extend through the support structure 12 to reach mounting pads 26-1, 26-2 of the LED package 10. In certain embodiments, the cover structure 24 may embody an encapsulant that covers and otherwise encapsulates the LED chip 22, the patterned trace 14-1, 14-2, and portions of the support structure 12. The cover structure 24 may comprise silicone, glass, or the like and in certain embodiments, the cover structure 24 may form the shape of a lens, such as the dome-shaped structure of FIG. 1B. Other suitable lens shapes include hemispheric, ellipsoid, ellipsoid bullet, cubic, flat, hex-shaped, and square. In certain embodiments, a suitable shape includes both curved and planar surfaces, such as a hemispheric or curved top portion with planar side surfaces. In certain embodiments, the cover structure 24 may conformally cover the topography on the topside of the support structure 12 to effectively encapsulate the LED chip 22 and patterned trace 14-1, 14-2. During exposure to various operating conditions, environmental ingress can occur such that reactants foreign to the LED package 10, such as one or more of oxygen, water, sulfur, carbon monoxide, and/or methane, can reach the LED chip 22 and/or the patterned trace 14-1, 14-2. Such environmental ingress can compromise the integrity of LED package 10 by causing corrosion and/or metal migration and adversely impact performance.

Figure 2A:
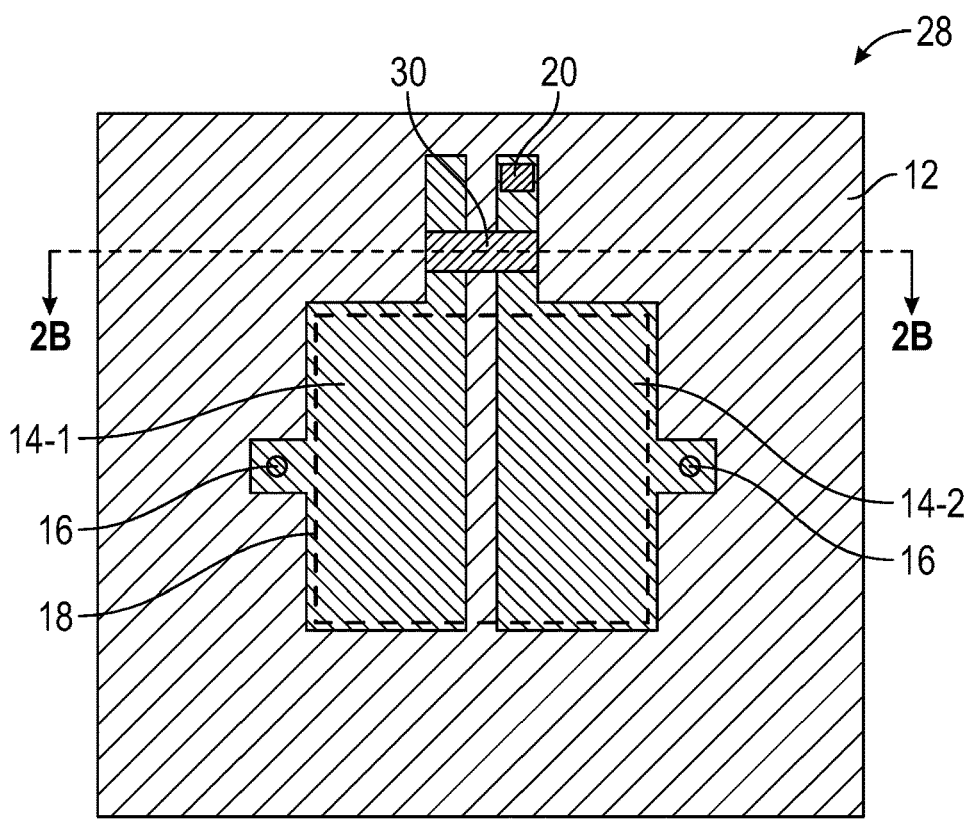
FIG. 2A is a top view of an exemplary LED package that is similar to the LED package of FIGS. 1A and 1B and further includes a reactive material arranged to cause the LED chip to turn on with exposure to environmental reactants.

FIG. 2A is a top view of an exemplary LED package 28 that is similar to the LED package 10 of FIGS. 1A and 1B and further includes a reactive material 30 arranged to cause the LED chip to turn on with exposure to environmental reactants. By way of example, the trace 14-1 may form an anode and the trace 14-2 may form a cathode for the LED chip (e.g., 22 of FIG. 1B). The reactive material 30 is coupled between the anode and the cathode. As described above, the reactive material 30 may be formed of an electrically conductive material so that the anode is electrically coupled to the cathode through the reactive material 30. In this manner, the reactive material 30 forms an electrical shorting path that bypasses the LED chip mounted to the die attach pad 18. When the reactive material 30 is exposed to environmental reactants, the reactive material 30 may oxidize or otherwise degrade, thereby decreasing the electrical conductivity of the reactive material 30. With sufficient exposure and absorption of environmental reactants, the reactive material 30 may no longer form the electrical shorting path. As illustrated in FIG. 2A, the reactive material 30 may form a bridge between the trace 14-1 and the trace 14-2 along their respective protrusions for the electrical overstress element 20. In this manner, the reactive material 30 may be positioned outside a boundary of the die attach pad 18. In other embodiments, the reactive material 30 could alternatively be formed between any other portions of the trace 14-1 and the trace 14-2.

Figure 2B:
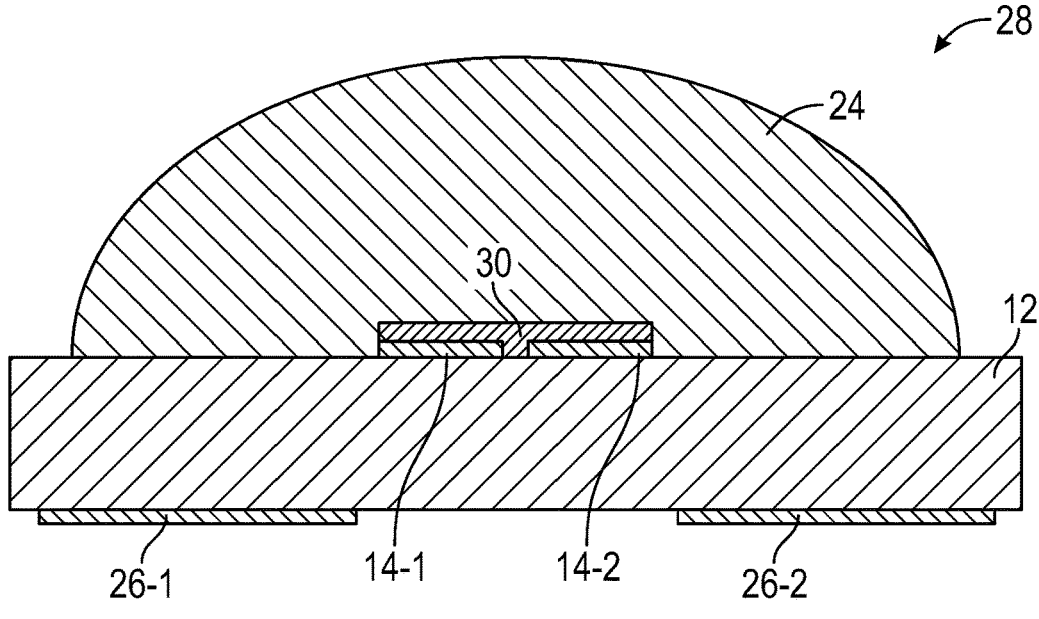
FIG. 2B is a cross-sectional view of the LED package of FIG. 2A taken along the sectional line 2B-2B of FIG. 2A.

FIG. 2B is a cross-sectional view of the LED package 28 of FIG. 2A taken along the sectional line 2B-2B of FIG. 2A. In the view of FIG. 2B, the reactive material 30 is on a top surface of each of the traces 14-1, 14-2 and the reactive material 30 continuously extends between the two traces 14-1, 14-2. As described above for FIG. 1B, the mounting pads 26-1, 26-2 may be respectively coupled to the traces 14-1, 14-2 by way of the vias 16 of FIG. 2A. In certain embodiments, the reactive material 30 may be arranged on portions of the support structure 12 that are between facing or adjacent sidewalls of the traces 14-1, 14-2, thereby at least partially filling a gap therebetween. In still further embodiments, the reactive material 30 is on a top surface of each of the traces 14-1, 14-2 and the reactive material 30 is on portions of the support structure 12 that are between sidewalls of the traces 14-1, 14-2. The reactive material 30 may be deposited or otherwise formed concurrently on the traces 14-1, 14-2 and portions of the support structure 12 therebetween. In other implementations, the reactive material 30 may embody a pre-formed structure that is subsequently attached to the traces 14-1, 14-2.

In view of the aspects described above, the reactive material 30 is configured to provide a first operating state where the LED chip is electrically shorted and a second operating state where the LED chip is electrically activated after exposure to environmental reactants. In both the first and second operating states, electrical power is provided to the anode and cathode (i.e., 14-1, 14-2). Accordingly, the LED package 28 is configured to indicate the presence of the environmental reactant when the LED chip is turned on and emitting light.

Figure 3:
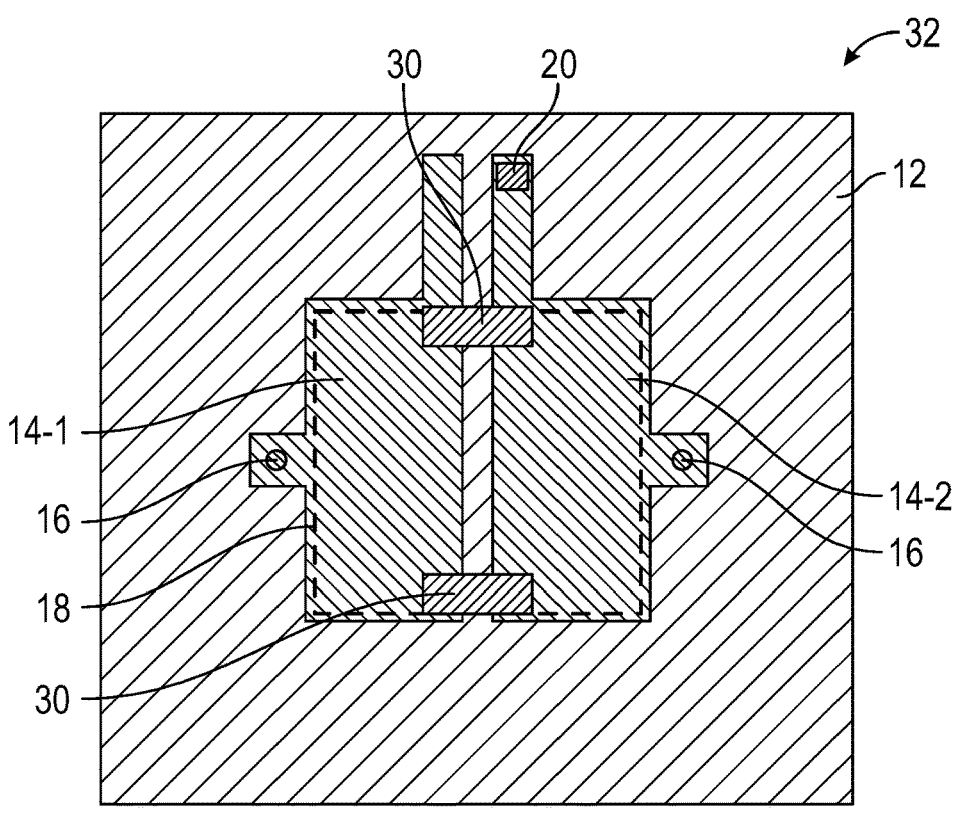
FIG. 3 is a top view of an LED package that is similar to the LED package of FIGS. 2A and 2B for embodiments where the reactive material is positioned within a boundary of the die attach pad.

FIG. 3 is a top view of an LED package 32 that is similar to the LED package 28 of FIGS. 2A and 2B for embodiments where the reactive material 30 is positioned within a boundary of the die attach pad 18. As illustrated, the reactive material 30 may form a bridge between the trace 14-1 and the trace 14-2 such that the reactive material 30 is between the LED chip (e.g., 22 of FIG. 1B) and the support structure 12. In certain embodiments, the reactive material 30 may form multiple bridges between the traces 14-1 and 14-2.

Figure 4:
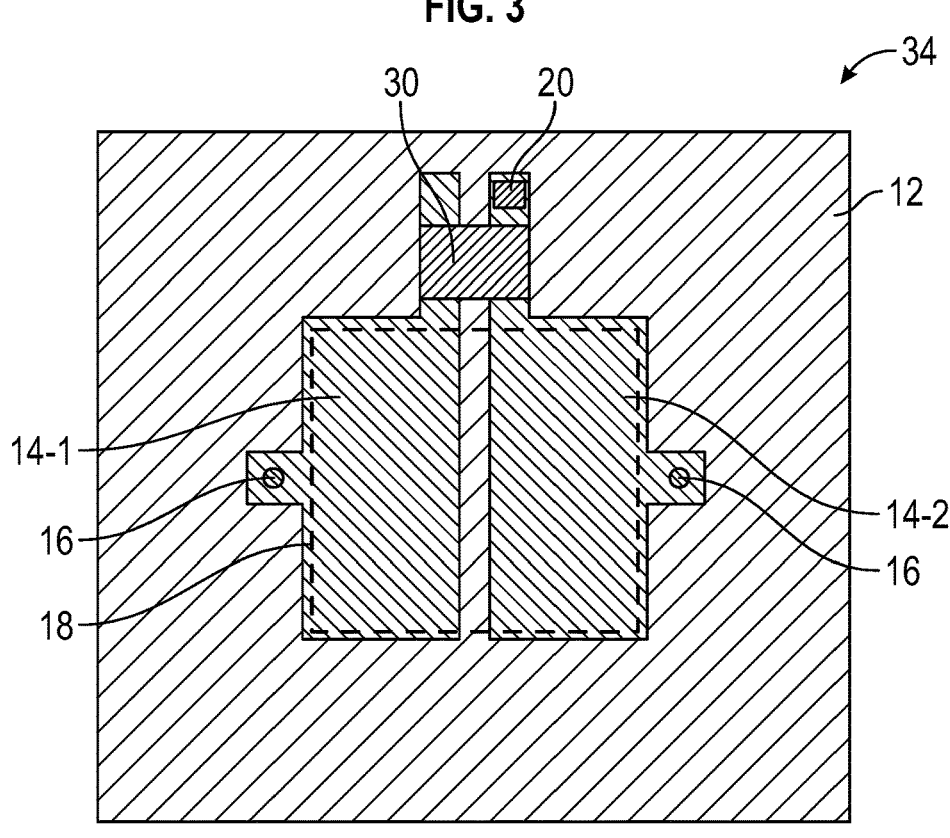
FIG. 4 is a top view of an LED package that is similar to the LED package of FIGS. 2A and 2B and where the reactive material is formed with increased surface area to delay visible indication of the presence of environmental reactants.

FIG. 4 is a top view of an LED package 34 that is similar to the LED package 28 of FIGS. 2A and 2B and where the reactive material 30 is formed with increased surface area to delay visible indication of the presence of environmental reactants. As described above, the amount and/or time of reactant exposure before visible indication is provided may be tailored by changing a surface area of the reactive material 30. For example, the reactive material 30 in FIG. 4 forms a wider bridge than the embodiments of FIG. 2A. Accordingly, the reactive material 30 of FIG. 4 may maintain electrical shorting under longer reactant exposure. For example, degradation, oxidation and/or reduction may initially occur along a perimeter of the reactive material 30 before propagating inward to middle portions of the reactive material 30. In this manner, electrically conductive shorting paths are maintained for longer exposure times and/or increased exposure amounts. In view of the above, thresholds for visible indication of environmental reactants may be tailored to different tolerances. By way of example, the reactive material 30 in FIG. 4 may cover at least half of a surface area of the protrusions for each of the traces 14-1 and 14-2 that extend away from the die attach pad 18.

Figure 5A:
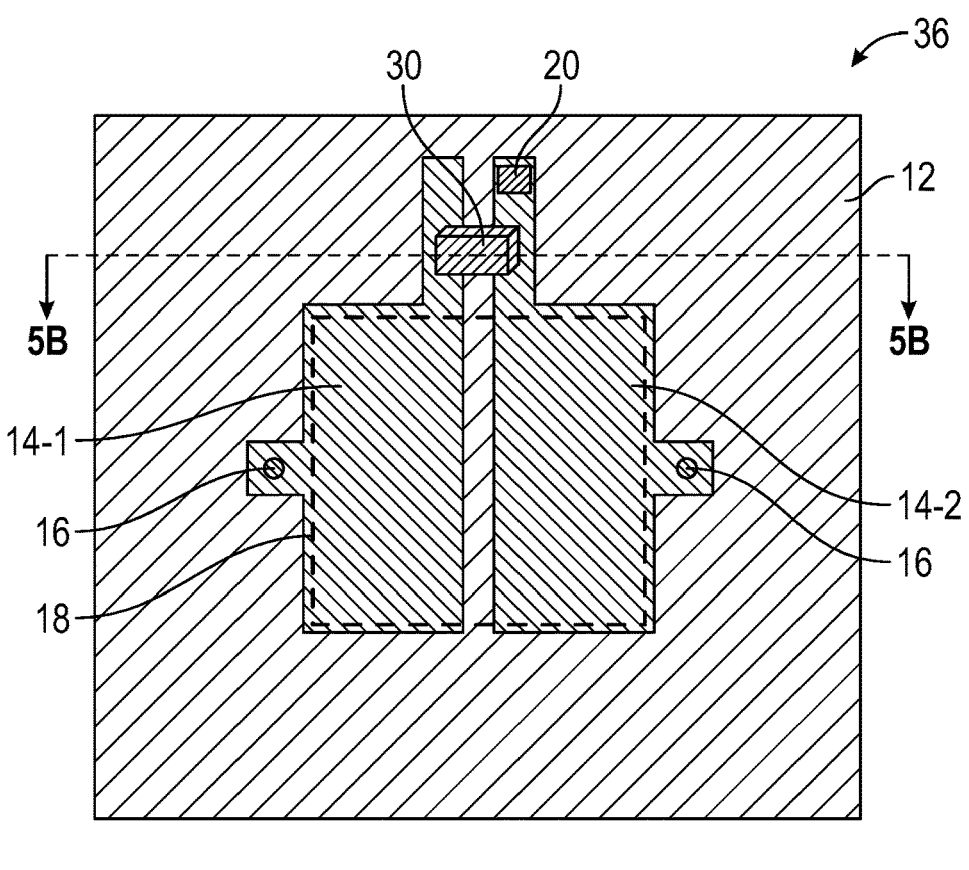
FIG. 5A is a top view of an LED package that is similar to the LED package of FIG. 4 where the reactive material is formed with an increased thickness to delay visible indication of the presence of environmental reactants.
Figure 5B:
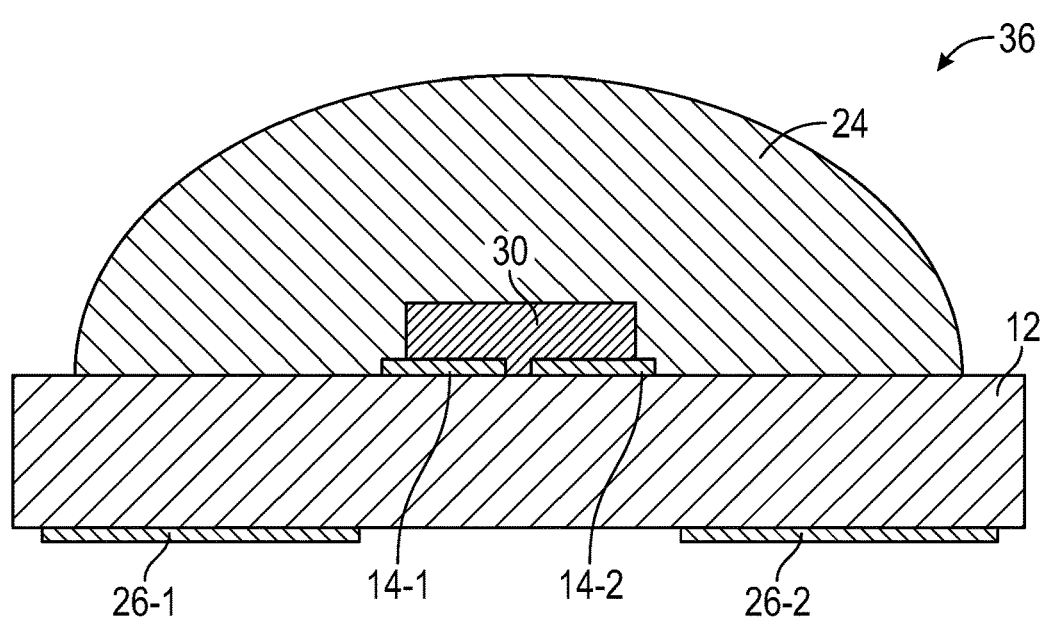
FIG. 5B is a cross-sectional view of the LED package of FIG. 5A taken along the sectional line 5B-5B of FIG. 5A.

FIG. 5A is a top view of an LED package 36 that is similar to the LED package 34 of FIG. 4 where the reactive material 30 is formed with an increased thickness to delay visible indication of the presence of environmental reactants. FIG. 5B is a cross-sectional view of the LED package 36 of FIG. 5A taken along the sectional line 5B-5B of FIG. 5A. During reactant exposure, degradation, oxidation and/or reduction may initially occur along a perimeter and/or along a top surface of the reactive material 30 before propagating inward to middle portions of the reactive material 30. In a similar manner to the LED package 34 of FIG. 4, electrically conductive shorting paths are maintained for longer exposure times and/or increased exposure amounts. By way of example, the reactive material 30 in FIG. 5 may have a thickness above the support structure 12 that is at least two times, or at least three times, or in a range from two times to ten times a corresponding thickness of either of the traces 14-1 and 14-2.

Figure 6A:
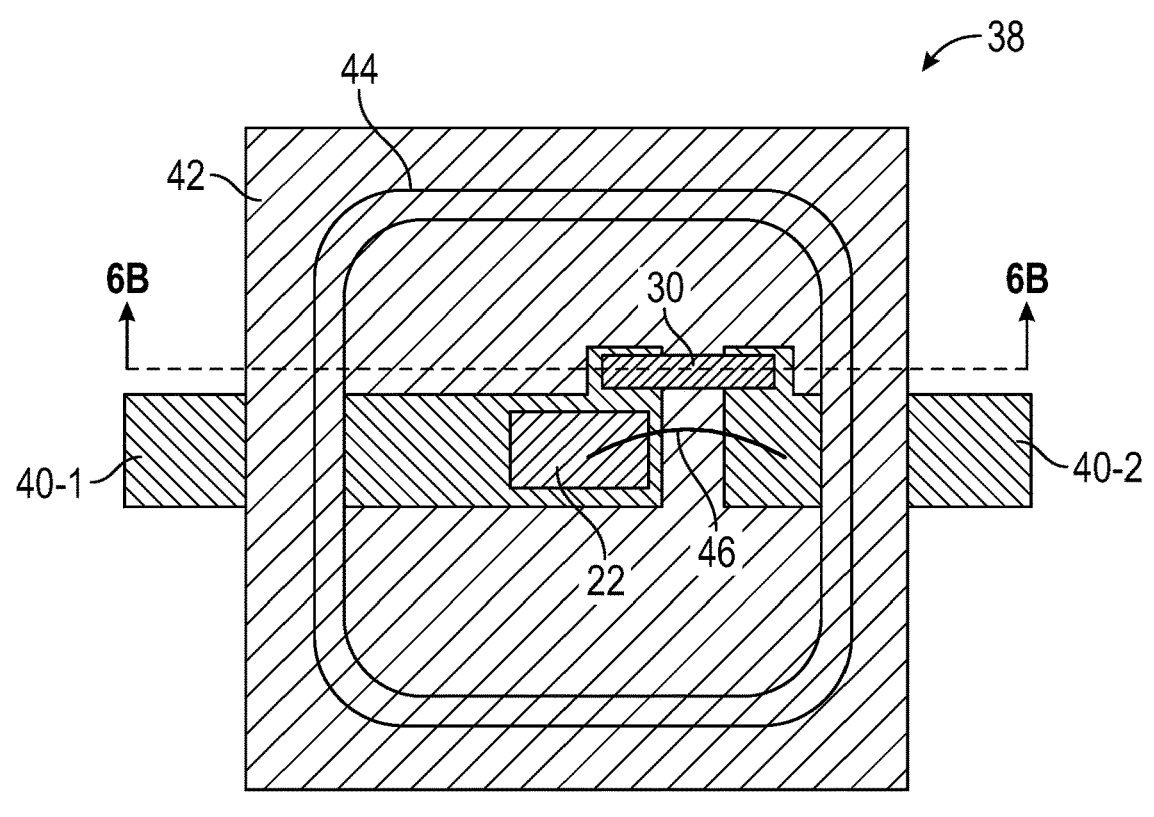
FIG. 6A is a top view of the LED package that is similar to the LED package of FIG. 2A for embodiments where the support structure embodies a lead frame structure.
Figure 6B:
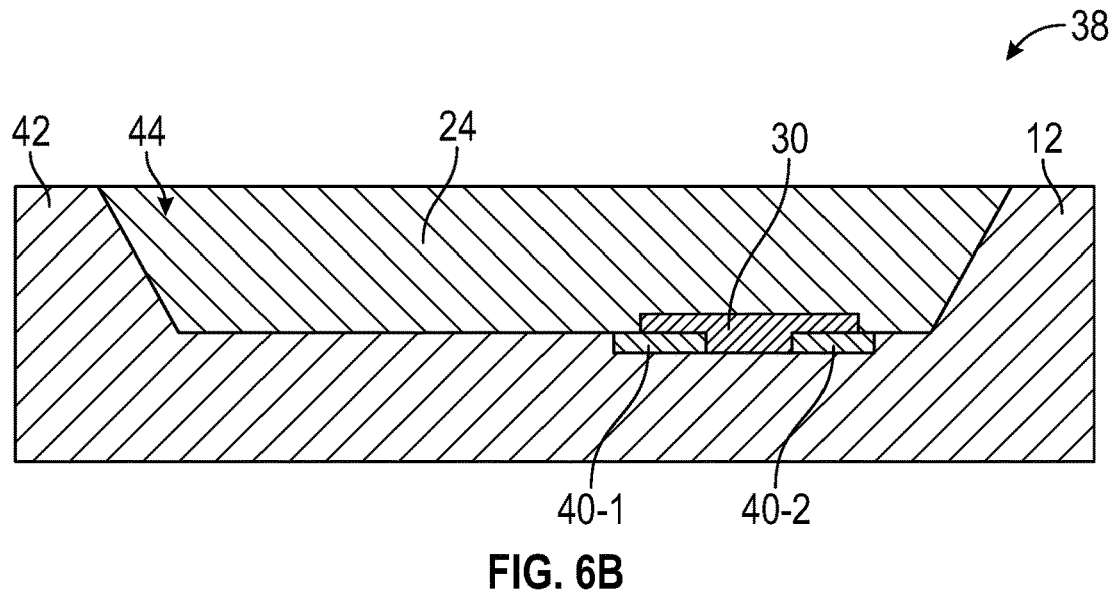
FIG. 6B is a cross-sectional view of the LED package of FIG. 6A taken along the sectional line 6B-6B of FIG. 6A.

While the previous illustrations for FIGS. 1A to 5B are provided in the context where the support structure 12 comprises a submount with the patterned trace 14-1, 14-2, any of the arrangements of the reactive material 30 may also be applicable to embodiments where the support structure 12 embodies a lead frame structure. In this manner, the electrical connections provided by the patterned trace 14-1, 14-2 may be replaced with leads of a lead frame structure that is provided throughout portions of a lead frame body of insulating material. FIGS. 6A and 6B provide exemplary illustrations of an LED package 38 including lead frame structures with the reactive material 30 as previously described. FIGS. 6A and 6B are meant to generally illustrate lead frame structures that could be implemented with any of the arrangements of the reactive material 30 described above for FIGS. 2A to 5B.

FIG. 6A is a top view of the LED package 38 that is similar to the LED package 28 of FIG. 2A for embodiments where the support structure 12 embodies a lead frame structure. FIG. 6B is a cross-sectional view of the LED package 28 taken along the sectional line 6B-6B of FIG. 6A. As illustrated, the support structure 12 includes leads 40-1, 40-2 that collectively form portions of a lead frame that is partially embedded within a body 42 of insulating material. The body 42 forms a recess 44 where the LED chip 22 resides, and the LED chip 22 is electrically coupled to the leads 40-1, 40-2 at a floor of the recess 44. As illustrated, the LED chip 22 may be connected to the leads 40-1, 40-2 by way of at least one wire bond 46, although the LED chip 22 could alternatively be flip-chip mounted to the leads 40-1, 40-2 without deviating from the principles disclosed. The cover structure 24 may embody an encapsulant material that fills the recess 44 of the body 42 around the LED chip 22. While a top surface of the cover structure 24 is illustrated as flat, the top surface could be formed in the shape of a curved lens above the body 42. As illustrated, the reactive material 30 may form a bridge that couples the lead 40-1 to the lead 40-2, thereby forming an electrical shorting path for the LED chip 22. After sufficient reactant exposure, the reactive material 30 may oxidize and/or degrade as previously described, thereby permitting the LED chip 22 to be electrically activated for indicating the presence of one or more reactants. As best illustrated in FIG. 6A, portions of the leads 40-1, 40-2 may form tabs or protrusions away from the mounting surfaces of the LED chip 22 and/or wire bond 46 to accommodate the reactive material 30.

While the previous embodiments are described in the context of identifying the presence of environmental reactants by turning on LED chips, other embodiments may provide notification by reducing brightness and/or turning off LED chips of LED packages. For example, one or more reactive materials may be formed as a part of an anode and/or cathode electrical connection such that when the reactive material loses electrical conductivity, the electrically conductive path for the anode and/or cathode may exhibit increased resistivity and/or be electrically open. In this regard, the reactive materials provide a first operating state where LED chips are electrically activated and emitting light. After sufficient reactant exposure, the reactive materials may then provide a second operating state where the LED chips are either operating at a reduced brightness and/or are electrically deactivated. In this regard, such LED packages emit light during normal operation and the LED chips turn off to indicate the presence of environmental reactants.

Figure 7A:
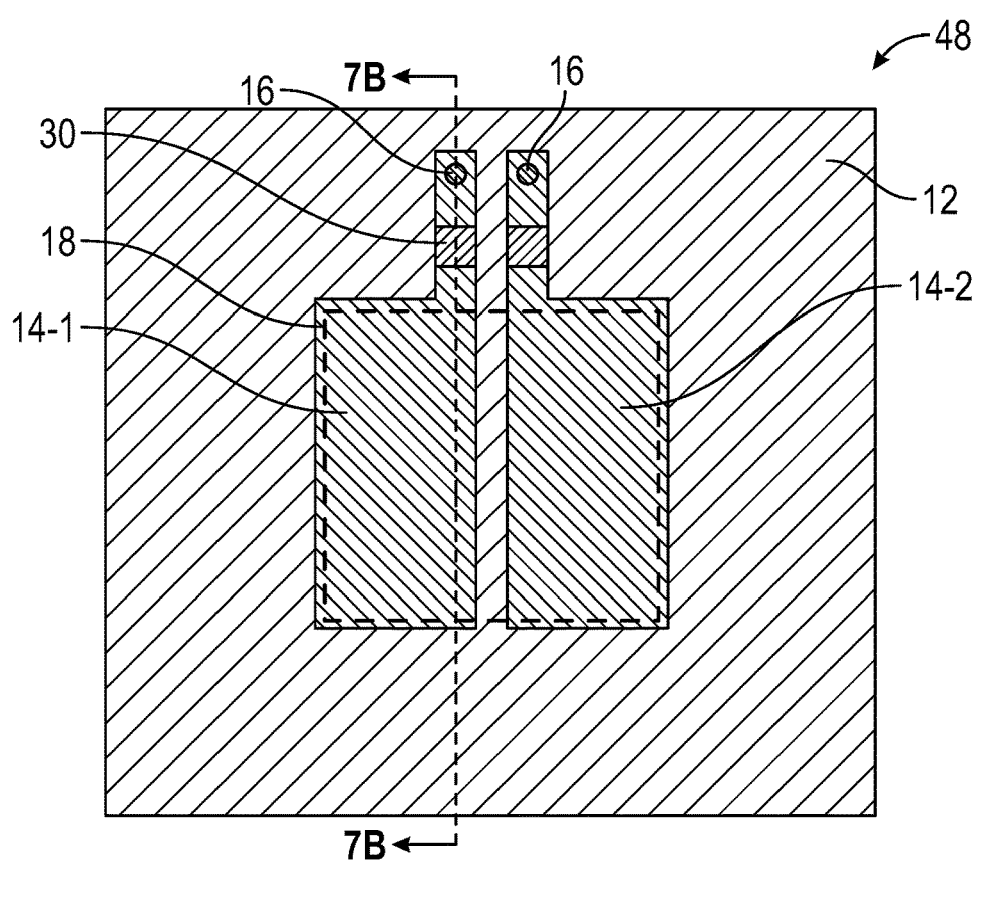
FIG. 7A is top view of an LED package that is similar to the LED package of FIG. 2A except the reactive material is positioned as part of the electrically conductive path for at least one of the traces.
Figure 7B:
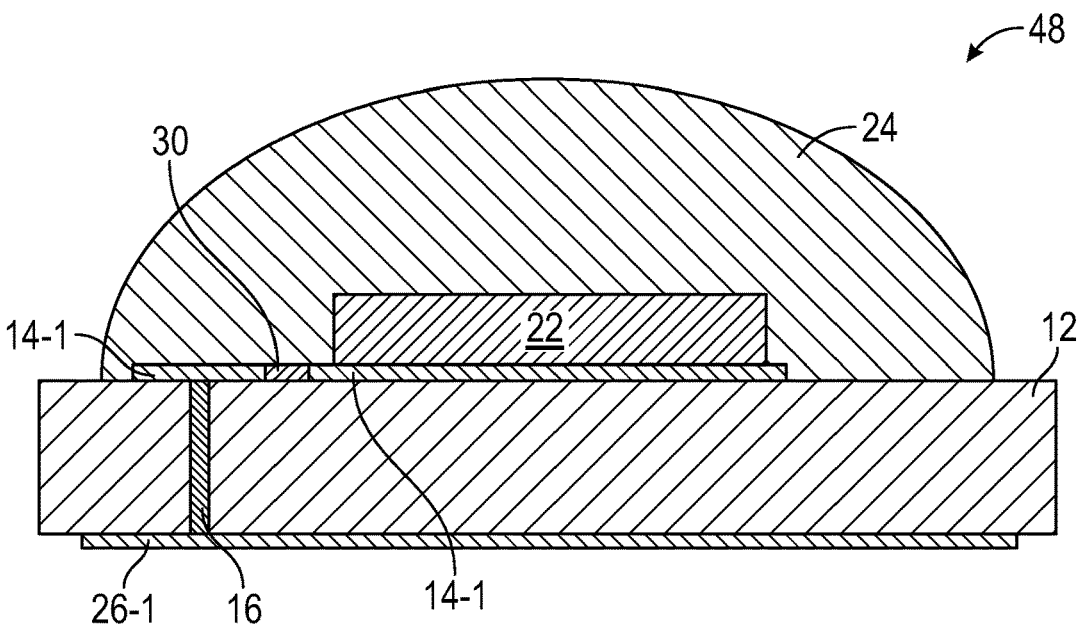
FIG. 7B is a cross-sectional view of the LED package of FIG. 7A taken along the sectional line 7B-7B of FIG. 7A.

FIG. 7A is top view of an LED package 48 that is similar to the LED package 28 of FIG. 2A except the reactive material 30 is positioned as part of the electrically conductive path for at least one of the traces 14-1, 14-2. FIG. 7B is a cross-sectional view of the LED package 48 taken along the sectional line 7B-7B of FIG. 7A. As illustrated, an electrically conductive path is formed from the mounting pad 26-1 to the LED chip 22 by way of the via 16, the trace 14-1, and the reactive material 30. In certain embodiments, the trace 14-1 is patterned with a gap that is subsequently filled with the reactive material 30 to maintain electrical conductivity. In this manner, the LED chip 22 may be electrically activated during normal operation. After sufficient reactant exposure, the reactive material 30 may lose electrical conductivity such that the electrically conductive path has increased resistivity and/or is broken, thereby reducing brightness and/or deactivating the LED chip 22. In certain embodiments, the LED chip 22 may first lose brightness before being electrically deactivated. In certain embodiments, a first portion of the reactive material 30 is provided as part of the trace 14-1 and a second portion of the reactive material 30 is provided as part of the trace 14-2 as illustrated in FIG. 7A, thereby forming parts of both anode and cathode electrically conductive paths.

Figure 8:
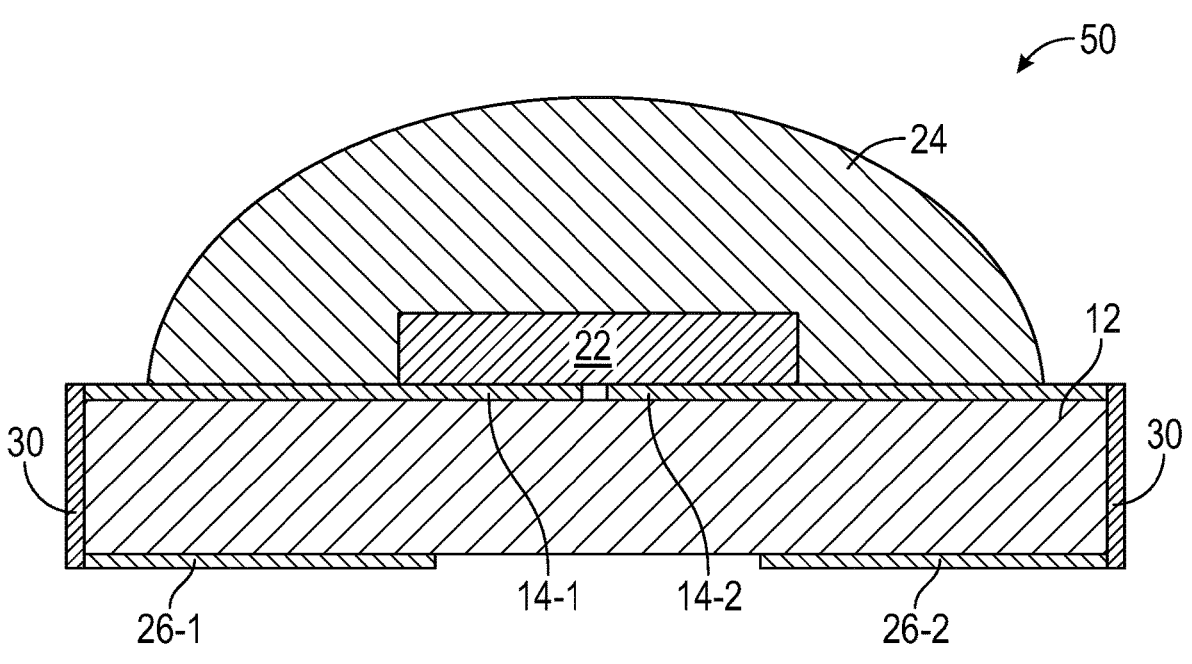
FIG. 8 is a cross-sectional view of an LED package that is similar to the LED package of FIGS. 7A and 7B for embodiments where the electrically conductive paths traverse along perimeter edges of the support structure.

FIG. 8 is a cross-sectional view of an LED package 50 that is similar to the LED package 48 of FIGS. 7A and 7B for embodiments where the electrically conductive paths traverse along perimeter edges of the support structure 12. As illustrated, the first trace 14-1 is electrically coupled to the mounting pad 26-1 by a portion of the reactive material 30 that is arranged on a perimeter edge. In this manner, the reactive material 30 may extend along the perimeter edge from a top surface of the support structure 12 to a bottom surface of the support structure 12. As with the LED package 48 of FIG. 7, the reactive material 30 of FIG. 8 thereby forms part of an electrically conductive path (i.e., anode or cathode) with the first trace 14-1. Accordingly, the LED chip 22 is electrically active during a first operating state and after sufficient reactant exposure, the reactive material 30 degrades so that the LED chip 22 loses brightness and/or is electrically inactive during a second operating state. In certain embodiments, another portion of the reactive material 30 may form part of an electrically conductive path with the second trace 14-2 in a similar manner. In this regard, portions of the reactive material 30 may form parts of anode and cathode electrically conductive paths for the LED chip 22.

Figure 9:
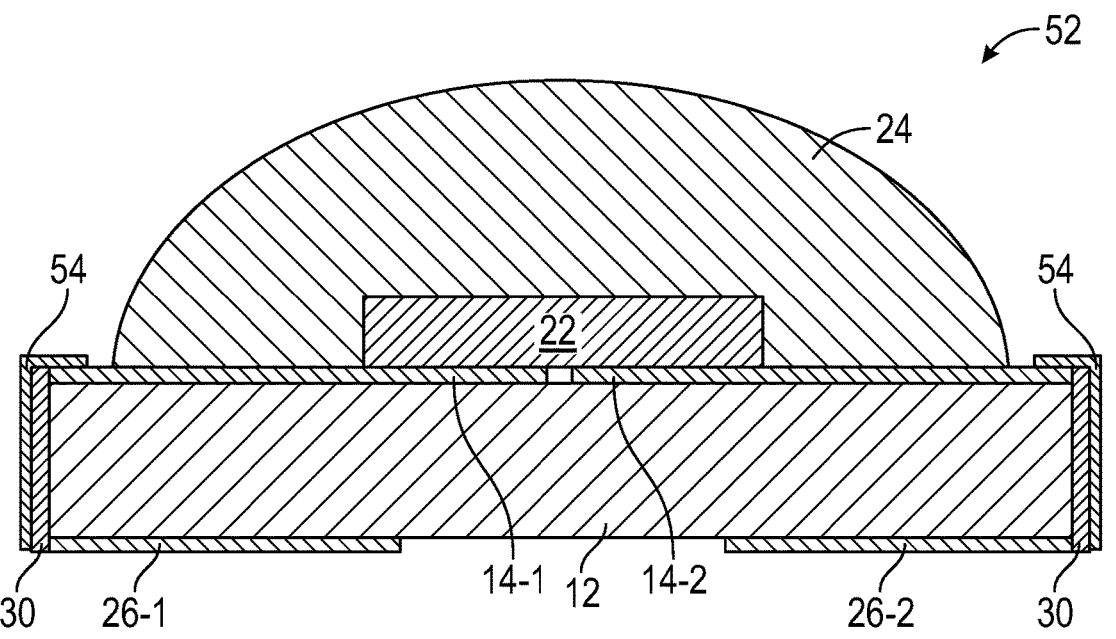
FIG. 9 is a cross-sectional view of an LED package that is similar to the LED package of FIG. 8 and further includes a membrane that covers the reactive material along perimeter edges of the support structure.

FIG. 9 is a cross-sectional view of an LED package 52 that is similar to the LED package 50 of FIG. 8 and further includes a membrane 54 that covers the reactive material 30 along perimeter edges of the support structure 12. The membrane 54 may comprise a material that selectively allows certain reactants to penetrate the membrane 54 while effectively preventing or reducing amounts of other reactants from reaching the reactive material 30. In this manner, the membrane 54 may form a layer or coating that tailors the LED package 52 to provide indication of certain reactant molecules while ignoring others. By way of example, the membrane 54 may be configured to prevent moisture from reaching the reactive material 30 while allowing another reactant, such as sulfur or carbon monoxide, to pass through more easily. In this example, the LED package may be specifically tailored to indicate the presence of sulfur or carbon monoxide. Other embodiments of the membrane 54 may be tailored for indication of other reactants. Exemplary materials for the membrane 54 include metal organic frameworks, microporous functionalized polymers, and/or protein membranes, among others. While the membrane 54 is illustrated on the reactive material 30 along the perimeter edges of the support structure 12, the membrane 54 may be implemented on the reactive material 30 for any embodiments of the present disclosure, including FIGS. 2A to 7 described above and FIGS. 10A to 12 described below.

Figure 10A:
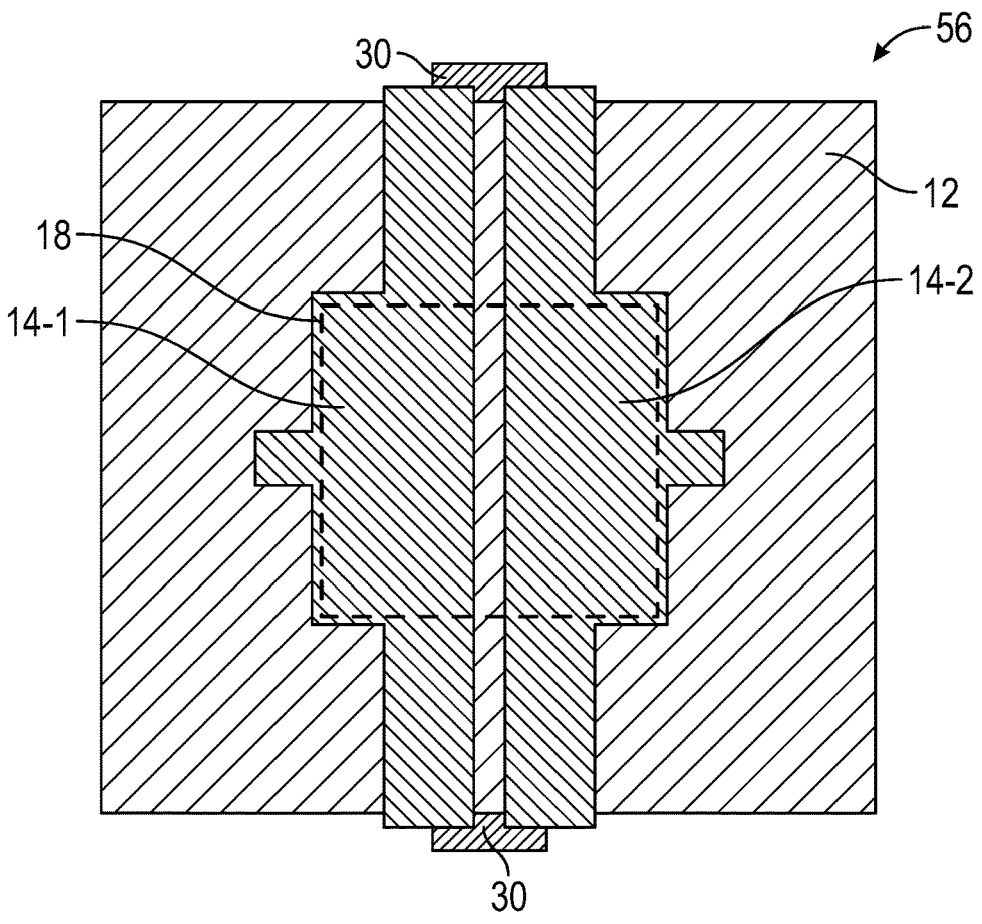
FIG. 10A is a top view of an LED package that is similar to the LED package of FIG. 8 except the reactive material is configured to electrically short the traces at an initial operating state.
Figure 10B:
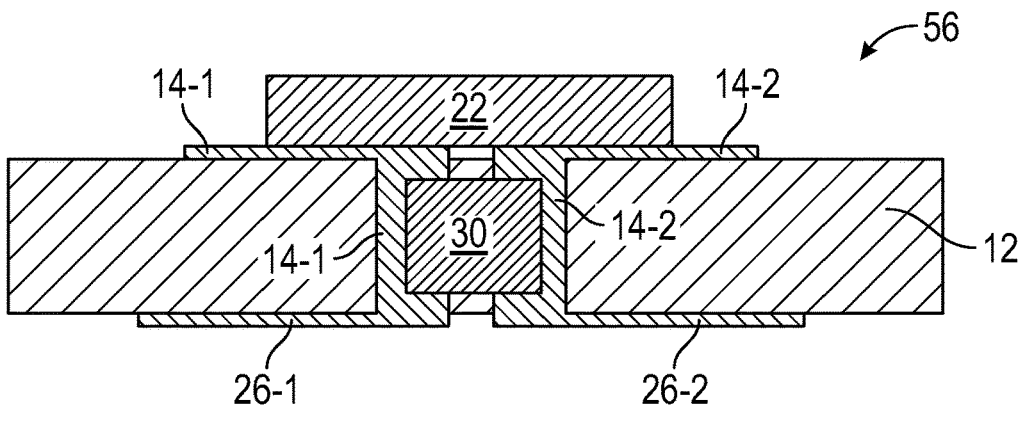
FIG. 10B is a side view of the LED package of FIG. 10A with the LED chip mounted to the traces.

FIG. 10A is a top view of an LED package 56 that is similar to the LED package 50 of FIG. 8 except the reactive material 30 is configured to electrically short the traces 14-1 and 14-2 at an initial operating state. FIG. 10B is a side view of the LED package 56 of FIG. 10A with the LED chip 22 mounted to the traces 14-1, 14-2. For illustrative purposes, the cover structure 24 of previous embodiments is not shown, but it is understood the cover structure 24 (e.g., of FIG. 8) may be present in the final structure for the LED package 56. As illustrated, the traces 14-1, 14-2 extend to perimeter edges of the support structure 12 and extend along the perimeter edges from the top surface to the bottom surface of the support structure 12. In this regard, the traces 14-1, 14-2 are electrically coupled between the LED chip 22 and the mounting pads 26-1, 26-2. By arranging the reactive material 30 to form a bridge between the traces 14-1, 14-2 along the perimeter edge of the support structure 12, the reactive material 30 may effectively short the LED chip 22 at a first operating state. After sufficient reactant exposure, the reactive material 30 may decrease electrical conductivity to the point where the LED chip 22 is electrically activated at a second operating state.

While previous aspects have been described in the context LED packages with a single LED chip, any of the LED packages described herein may include multiple LED chips. In further embodiments, the presence of multiple LED chips may permit the use of reactive materials with lower electrical conductivities or wider band gaps. For example, certain LED packages may have multiple LED chips that are electrically coupled in series such that a drive voltage for activating the LED chips is higher. The higher drive voltage may provide increased activation energies that allow the use of other material as electrical conductors, such as magnesium oxide and/or titanium oxide.

Figure 11:
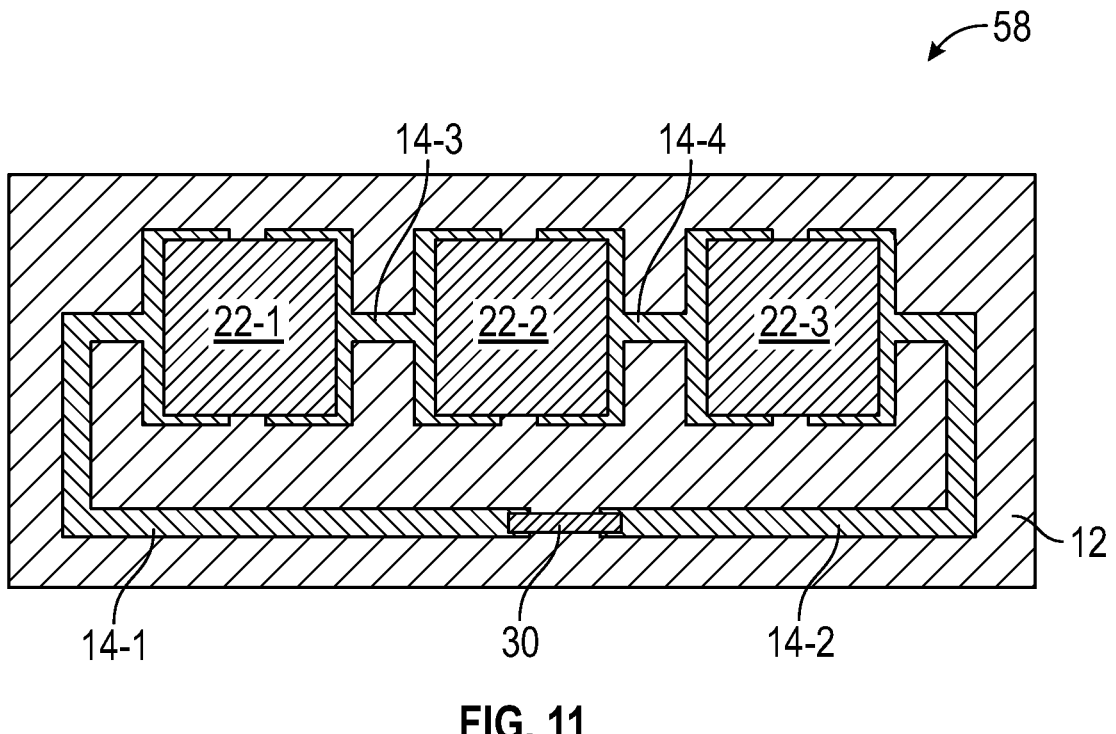
FIG. 11 is a top view of an LED package that includes an arrangement of the reactive material relative to multiple serially connected LED chips.

FIG. 11 is a top view of an LED package 58 that includes an arrangement of the reactive material 30 relative to multiple serially connected LED chips 22-1 to 22-3. The LED package 58 includes multiple traces 14-1 to 14-4 where the traces 14-3 and 14-4 electrically couple adjacent ones of the LED chips 22-1 to 22-3 together. In this regard, the trace 14-1 may serve as either the anode or cathode for the serial string of LED chips 22-1 to 22-3, and the trace 14-2 may serve as the other of the anode or cathode. The reactive material 30 forms a bridge that electrically couples the trace 14-1 to the trace 14-2 to effectively form a shorting path that bypasses the LED chips 22-1 to 22-3 at a first operating state. After sufficient reactant exposure, the shorting path may lose electrical conductivity to the point where the string of LED chips 22-1 to 22-3 is electrically activated. In the specific example of FIG. 11, three LED chips 22-1 to 22-3 coupled in series effectively triples the required drive voltage. Accordingly, material options for the reactive material 30 may be expanded beyond just metals. This may advantageously allow various oxides or other non-metal materials that have increased reactivity to various environmental reactants to be used. In FIG. 11, the traces 14-1 to 14-4 are illustrated on a top surface of the support structure 12. However, one or more portions of at least some of the traces 14-1 to 14-4 may extend along perimeter edges of the support structure 12 in a similar manner described above for FIGS. 10A and 10B. Furthermore, the arrangement of FIG. 11 may also be implemented for embodiments where the support structure 12 embodies a lead frame structure as described above for FIGS. 6A and 6B.

Figure 12:
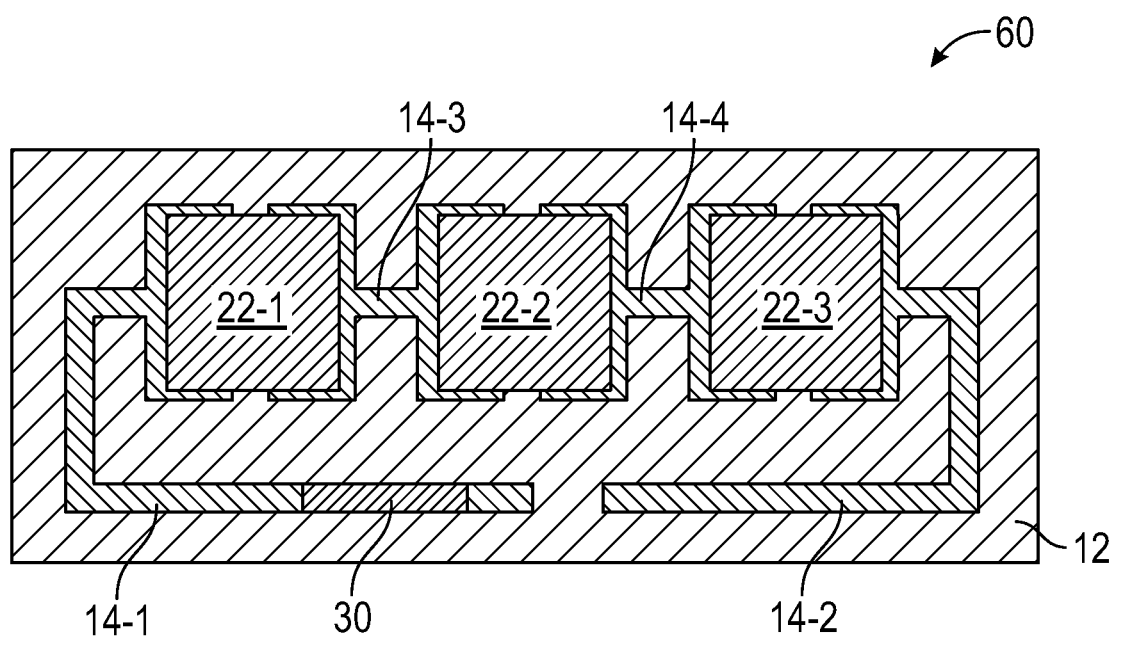
FIG. 12 is a top view of an LED package that is similar to the LED package of FIG. 11 except the reactive material is positioned as part of the electrically conductive path of at least one trace.

FIG. 12 is a top view of an LED package 60 that is similar to the LED package 58 of FIG. 11 except the reactive material 30 is positioned as part of the electrically conductive path of at least one trace 14-1. In this manner, the LED package 60 may be configured similar to the LED package 48 of FIGS. 7A and 7B but with the serially connected LED chips 22-1 to 22-3. In this manner, the LED chips 22-1 to 22-3 are electrically activated during a first operating state and electrically deactivated and/or exhibit reduced brightness after sufficient reactant exposure to the reactive material 30. In FIG. 12, the traces 14-1 to 14-4 are illustrated on a top surface of the support structure 12. However, one or more portions of at least some of the traces 14-1 to 14-4 may extend along perimeter edges of the support structure 12 in a similar manner described above for FIGS. 8 and 9. Furthermore, the arrangement of FIG. 12 may also be implemented for embodiments where the support structure 12 embodies a lead frame structure as described above for FIGS. 6A and 6B.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
at least one LED chip;
a support structure comprising electrical connections, the electrical connections comprising an anode and a cathode coupled to the at least one LED chip; and
a reactive material coupled between the anode and the cathode to provide a first operating state where the at least one LED chip is electrically shorted, the reactive material configured to decrease electrical conductivity with exposure to an environmental reactant to provide a second operating state where the at least one LED chip is electrically activated.

2. The LED package of claim 1, wherein the support structure comprises a submount and the electrical connections comprise a patterned trace on a top surface of the submount.

3. The LED package of claim 1, wherein the support structure comprises a lead frame structure and the electrical connections comprise portions of a lead frame.

4. The LED package of claim 1, further comprising a membrane on the reactive material, the membrane configured to permit the environmental reactant to pass through the membrane while reducing amounts of another environment reactant that pass through the membrane.

5. The LED package of claim 1, wherein the electrical connections extend on a perimeter edge of the support structure and the reactive material is positioned on the perimeter edge.

6. The LED package of claim 1, wherein the at least one LED chip comprises a plurality of LED chips electrically coupled in series.

7. The LED package of claim 1, wherein the reactive material forms a bridge that is coupled between the anode and the cathode.

8. The LED package of claim 7, wherein the bridge extends from a top surface of the anode to a top surface of the cathode.

9. The LED package of claim 7, wherein the bridge extends between sidewalls of the anode and the cathode.

10. The LED package of claim 7, wherein the reactive material forms an additional bridge that is coupled between the anode and the cathode.

11. The LED package of claim 7, wherein portions of the anode and cathode form a die attach pad for the at least one LED chip and the bridge is arranged within a boundary of the die attach pad.

12. The LED package of claim 7, wherein the bridge comprises a thickness above the support structure that is in a range from two times to ten times a thickness of the anode or cathode.

13. The LED package of claim 7, wherein the anode and cathode form a die attach pad for the at least one LED chip and the bridge is arranged on portions of the anode and cathode that are outside the die attach pad.

14. The LED package of claim 13, wherein the bridge covers at least half of a surface area of the portions of the anode and the cathode that are outside the die attach pad.

* * * * *